(12) United States Patent
Kang et al.

(10) Patent No.: US 11,011,473 B2
(45) Date of Patent: May 18, 2021

(54) SEMICONDUCTOR PACKAGE

(71) Applicant: SAMSUNG ELECTRONICS CO., LTD., Suwon-si (KR)

(72) Inventors: Younhee Kang, Asan-si (KR);
Byoung-Gug Min, Seongnam-si (KR);
Shi-Kyung Kim, Hwaseong-si (KR);
Min-Woo Song, Sejong-si (KR);
Jae-Seon Hwang, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/519,788

(22) Filed: Jul. 23, 2019

(65) Prior Publication Data
US 2020/0194380 A1 Jun. 18, 2020

(30) Foreign Application Priority Data
Dec. 17, 2018 (KR) ........................ 10-2018-0163464

(51) Int. Cl.
*H01L 23/29* (2006.01)
*H01L 21/00* (2006.01)
*H01L 23/552* (2006.01)
*H01L 23/31* (2006.01)
*H01L 23/00* (2006.01)

(52) U.S. Cl.
CPC ........ *H01L 23/552* (2013.01); *H01L 23/3128* (2013.01); *H01L 24/48* (2013.01)

(58) Field of Classification Search
CPC ....... H01L 23/552–556; H01L 27/3272; H01L 29/78633

USPC ...... 438/57–64, 125–127; 257/458, 788–795
See application file for complete search history.

(56) References Cited

U.S. PATENT DOCUMENTS

| | | | |
|---|---|---|---|
| 6,042,267 A * | 3/2000 | Muraki | G01T 1/2018 348/E5.086 |
| 6,667,480 B2 | 12/2003 | Kajiwara et al. | |
| 8,664,751 B2 | 3/2014 | Kim et al. | |
| 8,736,032 B2 | 5/2014 | Kim et al. | |
| 8,766,429 B2 | 7/2014 | Kim | |
| 9,685,413 B1 | 6/2017 | Prakash et al. | |
| 9,754,896 B2 | 9/2017 | Read et al. | |
| 9,768,154 B2 | 9/2017 | Tomonari et al. | |
| 9,991,211 B2 * | 6/2018 | Prakash | H01L 21/56 |
| 10,177,096 B2 | 1/2019 | Min et al. | |
| 10,629,457 B2 * | 4/2020 | Kawamori | H01L 21/565 |
| 2004/0150091 A1 * | 8/2004 | Stobbs | G11C 11/16 257/687 |

(Continued)

FOREIGN PATENT DOCUMENTS

| | | |
|---|---|---|
| JP | 2001-511202 A | 8/2001 |
| JP | 3946051 B2 | 7/2007 |

(Continued)

*Primary Examiner* — Calvin Lee
(74) *Attorney, Agent, or Firm* — Sughrue Mion, PLLC

(57) ABSTRACT

Disclosed is a semiconductor package comprising a substrate, a semiconductor chip on the substrate, a molding layer on the substrate covering the semiconductor chip, and a shield layer on the molding layer. The shield layer includes a polymer in which a plurality of conductive structures and a plurality of nano-structures are distributed wherein at least some of the conductive structures are connected to one another.

17 Claims, 9 Drawing Sheets

(56) References Cited

U.S. PATENT DOCUMENTS

| | | | |
|---|---|---|---|
| 2013/0082368 A1* | 4/2013 | Kim | H01L 23/3135 |
| | | | 257/659 |
| 2013/0202848 A1 | 8/2013 | Kim et al. | |
| 2015/0076670 A1* | 3/2015 | Pan | H01L 23/3135 |
| | | | 257/659 |

FOREIGN PATENT DOCUMENTS

| | | |
|---|---|---|
| JP | 4532782 B2 | 8/2010 |
| JP | 6049121 B2 | 12/2016 |
| KR | 10-1046250 B1 | 7/2011 |
| KR | 10-2013-0090121 A | 8/2013 |
| KR | 10-1478510 B1 | 1/2015 |

* cited by examiner

SEMICONDUCTOR PACKAGE

CROSS-REFERENCE TO THE RELATED APPLICATION

This application claims priority from Korean Patent Application No. 10-2018-0163464 filed on Dec. 17, 2018 in the Korean Intellectual Property Office, the entire disclosure of which is incorporated herein by reference.

BACKGROUND

The present inventive concepts relate to a semiconductor package, and more particularly, to a semiconductor package including a shield layer.

A semiconductor package is provided to implement an integrated circuit chip to qualify for use in electronic products. The semiconductor package is typically configured such that a semiconductor chip is mounted on a printed circuit board (PCB) and bonding wires or bumps are used to electrically connect the semiconductor chip to the PCB. In inspecting the semiconductor package including the semiconductor chip, electromagnetic interference may occur between the semiconductor package and other electronic devices.

SUMMARY

Some example embodiments of the inventive concepts provide a semiconductor package with improved reliability.

An object of the inventive concepts is not limited to the mentioned above, and other objects which have not been mentioned above will be clearly understood to those skilled in the art from the following description.

According to some example embodiments, there is provided a semiconductor package which may include: a substrate; a semiconductor chip on the substrate; a molding layer, on the substrate, covering the semiconductor chip; and a shield layer on the molding layer. The shield layer may include a polymer in which a plurality of conductive structures and a plurality of nano-structures are distributed, wherein at least some of the conductive structures are connected to one another.

According to some example embodiments, there is provided a semiconductor package which may include: a substrate; a semiconductor chip on the substrate; a molding layer, on the substrate, covering the semiconductor chip; and a shield layer on the molding layer. The shield layer may include a plurality of electromagnetic-wave shielding structures and a plurality of X-ray shielding structures.

According to some example embodiments, there is provided a semiconductor package which may include: a substrate; a semiconductor chip on the substrate; a molding layer, on the substrate, and covering the semiconductor chip; and a shield layer on the molding layer. The shield layer may include: a plurality of conductive structures connected to each other; and a plurality of first nano-structures in the shield layer. The first nano-structures may include a semiconductor material.

DETAILED DESCRIPTION OF THE EXAMPLE EMBODIMENTS

Figure 1A:
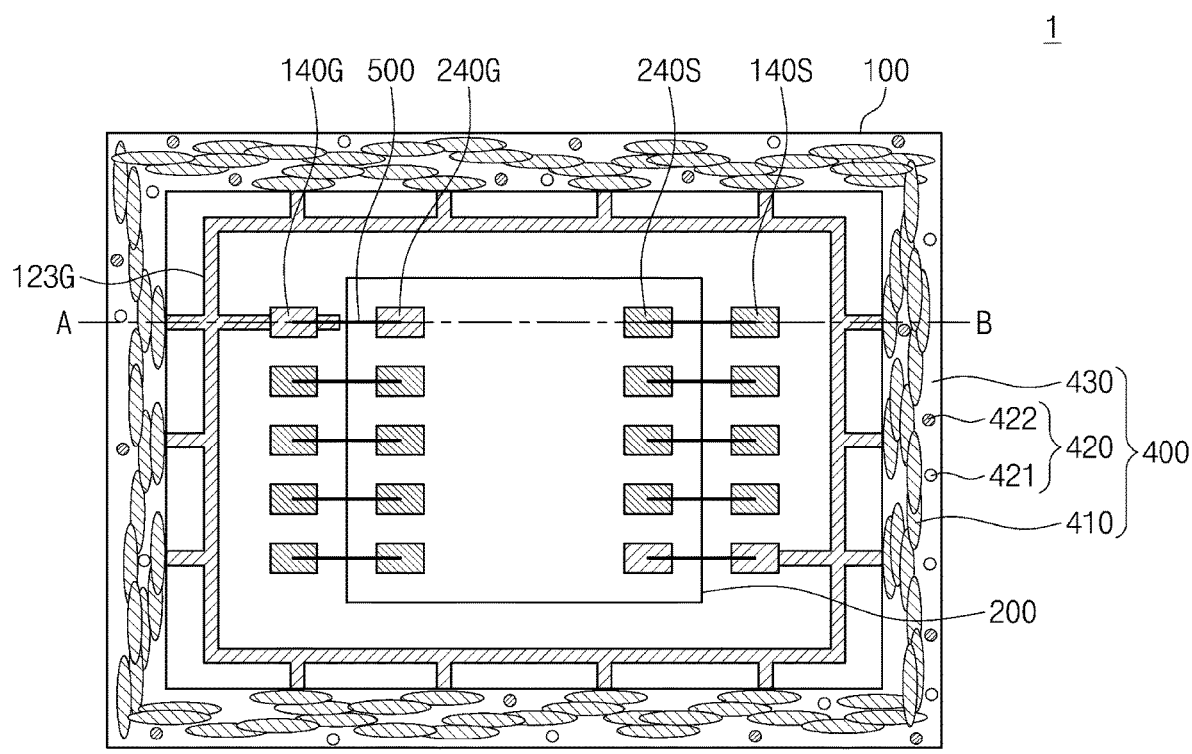
FIG. 1A illustrates a plan view showing a semiconductor package according to some example embodiments.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

In this description, like reference numerals may indicate like components. The following will now describe a semiconductor package and a method of fabricating the same according to some example embodiments.

Figure 1B:
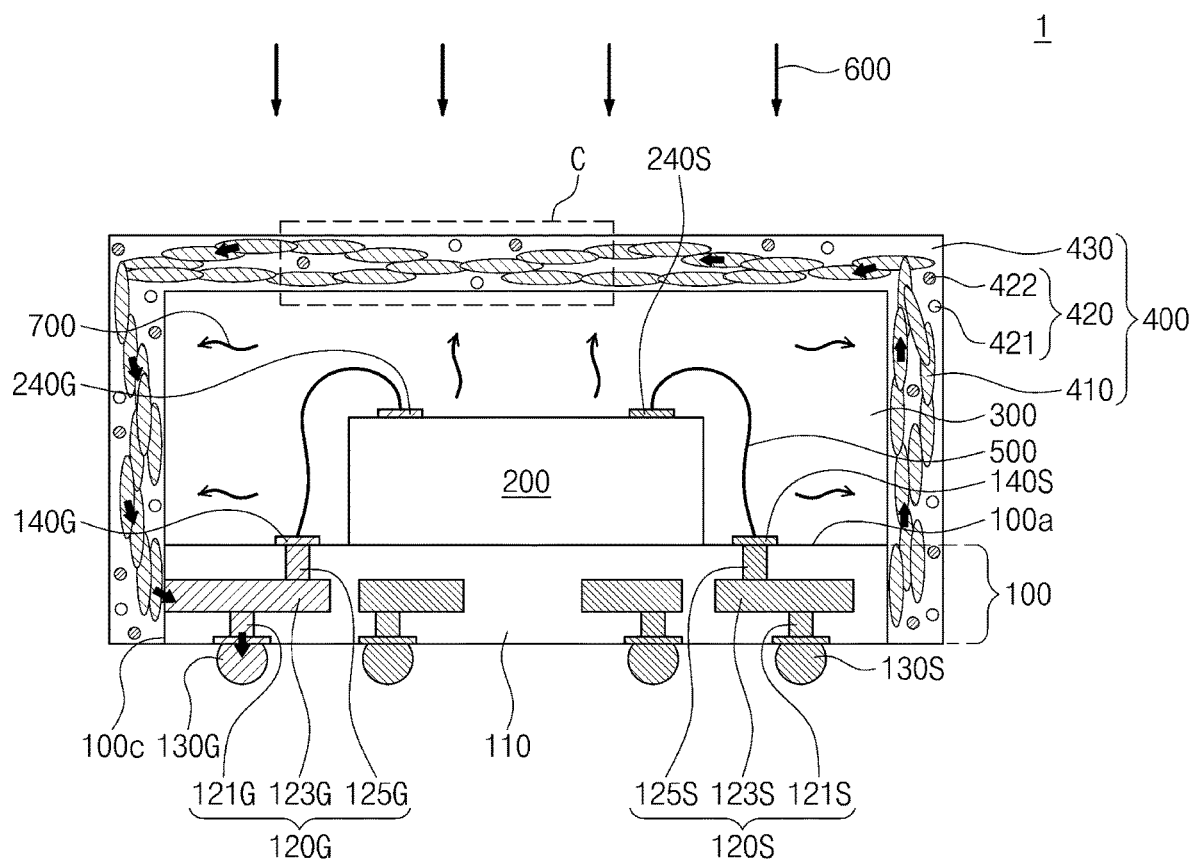
FIG. 1B illustrates a cross-sectional view taken along line A-B of FIG. 1A.

FIG. 1A illustrates a plan view showing a semiconductor package according to some example embodiments. FIG. 1B illustrates a cross-sectional view taken along line A-B of FIG. 1A.

Referring to FIGS. 1A and 1B, a semiconductor package 1 may include a substrate 100, a semiconductor chip 200, a molding layer 300, and a shield layer 400. The substrate 100 may be a printed circuit board (PCB), a semiconductor substrate, a redistribution layer, or a flexible substrate. The substrate 100 may include a dielectric layer 110, substrate pads 140S and 140G, a ground structure 120G, a signal structure 120S, and terminals 130G and 130S. The dielectric layer 110 may include a silicon-based dielectric material or a polymer. Although not shown, the dielectric layer 110 may include a plurality of layers.

The substrate pads 140G and 140S may be provided on a top surface of the dielectric layer 110. The top surface of the dielectric layer 110 may correspond to a top surface 100a of the substrate 100. The substrate pads 140G and 140S may include a ground substrate pad 140G and a signal substrate pad 140S that are spaced apart from each other. The signal substrate pad 140S may be insulated from the ground substrate pad 140G. The substrate pads 140G and 140S may include a conductive material, such as metal.

The terminals 130G and 130S may be disposed on a bottom surface of the dielectric layer 110. The bottom surface of the dielectric layer 110 may correspond to a bottom surface of the substrate 100. The terminals 130G and 130S may include a conductive material and have a solder ball shape. The terminals 130G and 130S may include a ground terminal 130G and a signal terminal 130S that are spaced apart from each other. The ground terminal 130G may be insulated from the signal terminal 130S. The ground terminal 130G may be configured to receive a ground voltage.

The ground structure 120G may be provided in the dielectric layer 110. The ground structure 120G may include a lower ground via 121G, a ground pattern 123G, and an upper ground via 125G. The dielectric layer 110 may include a plurality of layers, and the ground pattern 123G may be interposed between the plurality of layers. A portion of the ground pattern 123G may be exposed on one surface of the substrate 100. For example, the ground pattern 123G may be exposed on a side surface 100c of the substrate 100. The upper ground via 125G may be interposed between and coupled to the ground pattern 123G and the ground substrate pad 140G. The lower ground via 121G may be interposed between and coupled to the ground pattern 123G and the ground terminal 130G. Therefore, the ground substrate pad 140G may be coupled through the ground structure 120G to the ground terminal 130G. The lower ground via 121G may not be aligned in a vertical direction with the upper ground via 125G. The vertical direction may indicate a direction perpendicular to the top surface 100a of the substrate 100. The number, shape, and arrangement of the lower ground via 121G, the ground pattern 123G, and the upper ground via 125G may not be limited to that shown. The ground structure 120G may include a conductive material, such as metal.

The signal structure 120S may be provided in the dielectric layer 110. The signal structure 120S may include a lower signal via 121S, a signal pattern 123S, and an upper signal via 125S. The dielectric layer 110 may include a plurality of layers, and the signal pattern 123S may be interposed between the plurality of layers. The signal pattern 123S may not be exposed on the side surface 100c of the substrate 100. The upper signal via 125S may be interposed between and coupled to the signal pattern 123S and the signal substrate pad 140S. The lower signal via 121S may be interposed between and coupled to the signal pattern 123S and the signal terminal 130S. Therefore, the signal substrate pad 140S may be coupled through the signal structure 120S to the signal terminal 130S. The dielectric layer 110 may be interposed between the signal structure 120S and the ground structure 120G. The signal structure 120S may be spaced apart and insulated from the ground structure 120G. The signal structure 120S may include a conductive material, such as metal.

The semiconductor chip 200 may be mounted on the top surface 100a of the substrate 100. The semiconductor chip 200 may include therein integrated circuits, which may include a memory circuit, a logic circuit, or a combination thereof. The integrated circuits may include transistors. The semiconductor chip 200 may serve as a memory chip. For example, the memory chip may include a dynamic random access memory (DRAM). For another example, the memory chip may include a static random access memory (SRAM), a magnetic random access memory (MRAM), or a NAND flash memory. For another example, the semiconductor chip 200 may be a logic chip. In this description, the phrase "electrically connected to the semiconductor chip 200" may mean "electrically connected to the integrated circuits in the semiconductor chip 200."

Chip pads 240G and 240S may be provided on a top surface of the semiconductor chip 200. The chip pads 240G and 240S may be electrically connected to the integrated circuits in the semiconductor chip 200. The chip pads 240G and 240S may include a ground chip pad 240G and a signal chip pad 240S. The substrate 100 may be provided on its top surface 100a with connection terminals 500 electrically connecting the semiconductor chip 200 to the substrate 100. The connection terminals 500 may include bonding wires. The ground chip pad 240G may be electrically connected to the ground substrate pad 140G through one of the connection terminals 500. In this configuration, a ground voltage may be applied to the semiconductor chip 200 through the ground terminal 130G and the ground structure 120G. The signal chip pad 240S may be electrically connected to the signal substrate pad 140S through another of the connection terminals 500. Thus, when the semiconductor chip 200 operates, the semiconductor chip 200 may communicate electrical signals with an external device (not shown) through the connection terminals 500, the signal structure 120S, and the signal terminal 130S. Differently from that shown, the semiconductor chip 200 may be flip-chip mounted. In this case, the chip pads 240G and 240S may be disposed on a bottom surface of the semiconductor chip 200, and the connection terminals 500 may be interposed between the substrate 100 and the semiconductor chip 200. The connection terminals 500 may include one or more of a solder ball, a bump, or a pillar.

The substrate 100 may be provided thereon with the molding layer 300 covering the semiconductor chip 200. The molding layer 300 may include a dielectric polymeric material such as epoxy molding compound.

The shield layer 400 may be provided on a top surface of the molding layer 300, at lease one side surface of the molding layer 300, and at least one surface of the substrate 100. The one surface of the substrate 100 may be the side surface 100c. The shield layer 400 may have conductivity to shield electromagnetic interference (EMI) of the semiconductor package 1. The electromagnetic interference may mean that communication operations of electrical components suffer from disturbance caused by electromagnetic waves 700 emitted or transmitted from other electrical components. The electromagnetic wave 700 may have a frequency ranging from about 1 GHz to about 6 GHz. In certain embodiments, the semiconductor package 1 may include the shield layer 400 and prevent outward radiation of the electromagnetic wave 700 generated from the semiconductor chip 200. The semiconductor chip 200 may thus not interrupt an operation of other electronic devices. The other electronic devices may include a transmitter, a receiver, a passive device, and another semiconductor chip that are provided outside the semiconductor package 1.

The shield layer 400 may reflect or absorb the electromagnetic wave 700 generated from the integrated circuits of the semiconductor chip 200, the connection terminals 500, or the substrate 100. Because the ground pattern 123G is exposed on the side surface 100c of the substrate 100, the shield layer 400 may be electrically connected to the ground pattern 123G. The shield layer 400 may therefore be electrically grounded. An arrow illustrated in the shield layer 400 may schematically indicate a radiation path of the electromagnetic wave 700 in the shield layer 400. The electromagnetic wave 700 absorbed in the shield layer 400 may be outwardly radiated through the ground pattern 123G and the ground terminal 130G. The signal pattern 123S may not be exposed on the side surface 100c of the substrate 100. The signal pattern 123S may not be electrically connected to the shield layer 400.

In certain embodiments, the semiconductor package 1 may be irradiated with an X-ray 600 to inspect defects of the semiconductor package 1 in fabricating and inspecting the semiconductor chip 200. The X-ray 600 may be, for example, a soft X-ray. The soft X-ray may have an energy ranging from about 0.12 keV to about 12 keV. The soft X-ray may have a frequency ranging from about $2.9 \times 10^{16}$ Hz to about $2.9 \times 10^{18}$ Hz. The irradiation of the soft X-ray may inspect the transistors in the semiconductor chip 200. The inspection of the semiconductor chip 200 may be repeatedly performed. When the semiconductor chip 200 is excessively irradiated with the X-ray 600, the semiconductor chip 200 may be damaged. For example, the integrated circuits in the semiconductor chip 200 may be deteriorated. In certain embodiments, the shield layer 400 may partially shield the X-ray 600 irradiated to the semiconductor chip 200. The shield layer 400 may reduce an intensity and/or an amount of the X-ray 600 irradiated to the semiconductor chip 200. Accordingly, the semiconductor chip 200 may be prevented from being damaged during the inspection of the semiconductor chip 200. As a result, the semiconductor chip 200 may improve in reliability. The shield layer 400 will be further discussed below.

Figure 1C:
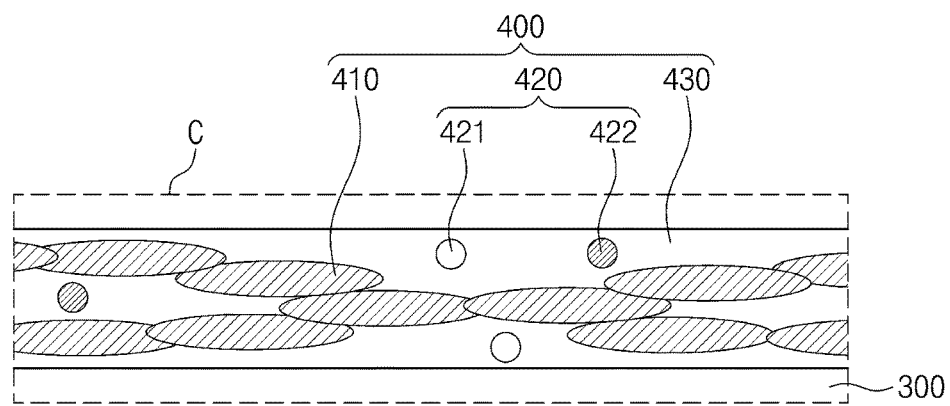
FIG. 1C illustrates an enlarged view showing section C of FIG. 1B.

FIG. 1C illustrates an enlarged view showing section C of FIG. 1B.

Referring to FIG. 1C together with the FIG. 1B, the shield layer 400 may include conductive structures 410, nano-structures 420, and a polymer 430. Because the shield layer 400 includes the conductive structures 410, the shield layer 400 may be conductive. The conductive structures 410 may serve as electromagnetic-wave shielding particles to shield the electromagnetic wave 700 generated from the semiconductor chip 200. For example, the conductive structures 410 may absorb the electromagnetic wave 700. The conductive structures 410 may include metal or metal oxide. For example, the conductive structures 410 may include silver (Ag) or silver oxide. For another example, the conductive structures 410 may include one or more of gold (Au), copper (Cu), nickel (Ni), iron (Fe), aluminum (Al), and oxide thereof. When the conductive structures 410 are spaced apart from one another, electrons may slowly or hardly migrate among the conductive structures 410. The conductive structures 410 may be physically and/or electrically connected to one another. For example, at least two of the conductive structures 410 may be in physical contact with each other. For another example, at least two of the conductive structures 410 may be chemically bonded into a conglomerate mass. For convenience of description, the conductive structures 410 are illustrated to have boundaries therebetween, but differently from that shown in FIGS. 1B and 1C, the conductive structures 410 may be connected to one another to have no visible boundaries therebetween. Because the conductive structures 410 are connected to one another, electrons may migrate at high speed among the conductive structures 410, with the result that the shield layer 400 may have a decreased resistance. As the resistance of the shield layer 400 is reduced, the electromagnetic waves 700 adsorbed in the shield layer 400 may be quickly transmitted to the exterior of the semiconductor package 1.

The conductive structures 410 may have a relatively high aspect ratio. In this description, the aspect ratio of a certain component may mean the ratio of the maximum diameter to the minimum diameter of the certain component. An average of maximum diameters of the conductive structures 410 may fall within a range of about 1 μm to about 5 μm. An average of minimum diameters of the conductive structures 410 may fall within a range of about 150 nm to about 500 nm. Because the conductive structures 410 have their high aspect ratios, electrons may more quickly transmit/migrate between the conductive structures 410, with the result that the shield layer 400 may have a more decreased resistance. The conductive structures 410 may be shaped like, for example, flakes or plates.

The conductive structures 410 may be coupled to the ground pattern 123G, and thus, the shield layer 400 may be electrically connected to the ground structure 120G. As shown by arrows in FIG. 1B, the conductive structures 410 may form radiation paths of the electromagnetic wave 700 in the shield layer 400. In this description, the phrase "coupled to/electrically connected to the shield layer 400" may include "electrically connected to the conductive structures 410 in the shield layer 400."

In certain embodiments, the conductive structures 410 may be stacked on the molding layer 300. When the conductive structures 410 are provided on the top surface of the molding layer 300, the conductive structures 410 may have their major axes substantially parallel to the top surface of the molding layer 300. When the conductive structures 410 are provided on the side surface of the molding layer 300, the conductive structures 410 may have their major axes substantially parallel to the side surface of the molding layer 300. However, the arrangement of the major axes of the conductive structures 410 is not limited to the above.

The nano-structure 420 may include first nano-structure 421 and second nano-structure 422. The first nano-structures 421 may include a semiconductor material. For example, the first nano-structures 421 may include silicon or silicon oxide. The first nano-structures 421 may include nano-particles. The nano-particles may have spherical shapes. The nano-particles may also have elliptical shapes. The first nano-structures 421 may serve as X-ray shielding structures. The X-ray shielding structures may be soft X-ray shielding structures. For example, the first nano-structures 421 may absorb and shield the X-ray 600 having a first energy. The first energy may fall within a range from about 0.12 keV to about 12 keV.

The second nano-structures 422 may include a different material from that of the first nano-structures 421. The second nano-structures 422 may include metal or metal oxide. For example, the second nano-structures 422 may include zinc or zinc oxide. For another example, the second nano-structures 422 may include one or more of gold (Au), copper (Cu), nickel (Ni), iron (Fe), aluminum (Al), and oxide thereof. The second nano-structures 422 may include a different metallic material from that of the conductive structures 410. The second nano-structures 422 may be X-ray shielding structures. For example, the second nano-structures 422 may be soft X-ray shielding structures. The second nano-structures 422 may absorb and shield the X-ray 600 having a second energy. The second energy may be different from the first energy. The second energy may fall within a range from about 0.12 keV to about 12 keV. In certain embodiments, because the shield layer 400 includes the first nano-structures 421 and the second nano-structures 422, the shield layer 400 may shield the X-ray 600 having a relatively wide energy band. For example, the shield layer 400 may shield first-energy X-ray and second-energy X-ray. The second nano-structures 422 may include nano-particles. The nano-particles may have spherical or elliptical shapes.

The polymer 430 may be provided in gaps between the conductive structures 410 and the nano-structures 420, between the conductive structures 410 and the molding layer 300, and between the nano-structures 420 and the molding layer 300. The polymer 430 may encapsulate the conductive structures 410. The polymer 430 may serve as a binder. For example, the polymer 430 may attach the conductive structures 410 and the nano-structures 420 to the molding layer 300. The polymer 430 may include one or more of, for example, epoxy polymer and polyurethane.

In certain embodiments, the first and second nano-structures 421 and 422 may be distributed in the shield layer 400. For example, each of the first and second nano-structures 421 and 422 may be distributed in and encapsulated by the polymer 430. The first nano-structures 421 may be spaced apart from one another. The second nano-structures 422 may be spaced apart from one another. Each of the first and second nano-structures 421 and 422 may be spaced apart from the conductive structures 410. The polymer 430 may be provided between the nano-structures 420.

Each of the first and second nano-structures 421 and 422 may have lower electrical conductivity and higher resistance than those of the conductive structures 410. Because the first and second nano-structures 421 and 422 are distributed, the first and second nano-structures 421 and 422 may have no effect on electrical connections between the conductive structures 410. The shield layer 400 may have low resistance characteristics.

In certain embodiments, an amount of the nano-structures 420 may be less than that of the conductive structures 410. For example, the amount of the nano-structures 420 may be about 0.01% to about 10% of that of the conductive structures 410. The amount may be weight, but the present inventive concepts are not limited thereto. The amount of the nano-structure 420 may mean a sum of amount of the first nano-structures 421 and amount of the second nano-structures 422. When the amount of the nano-structures 420 is less than 0.01% of that of the conductive structures 410, the shield layer 400 may be difficult to sufficiently shield the X-ray 600. When the amount of the nano-structures 420 is greater than about 10% of that of the conductive structures 410, the nano-structures 420 may be hardly distributed. In this case, the shield layer 400 may have an increased resistance and decreased electromagnetic-wave shielding characteristics. In certain embodiments, because the amount of the nano-structures 420 is about 0.01% to about 10% of that of the conductive structures 410, the shield layer 400 may satisfactorily shield the electromagnetic wave 700 and the X-ray 600.

In case that the nano-structures 420 have an excessively large average diameter (e.g., greater than about 100 nm), when the nano-structures 420 are provided between the conductive structures 410, the nano-structures 420 may interrupt electrical connections between the conductive structures 410. In this case, the shield layer 400 may have an increased resistance and decreased electromagnetic-wave shielding characteristics. In certain embodiments, the average diameter of each of the first and second nano-structures 421 and 422 may be less than an average of minimum diameters of the conductive structures 410. The average diameter of the first nano-structures 421 may be about 0.01 nm to about 100 nm, for example, about 0.01 nm to about 10 nm. The average diameter of the second nano-structures 422 may be about 0.01 nm to about 100 nm, for example, about 0.01 nm to about 10 nm. Accordingly, even when the conductive structures 410 have the nano-structures 420 interposed therebetween, the conductive structures 410 may be satisfactorily electrically connected to one another. As a result, the shield layer 400 may have low resistance characteristics and exhibit improved electromagnetic-wave shielding characteristics.

Figure 1D:
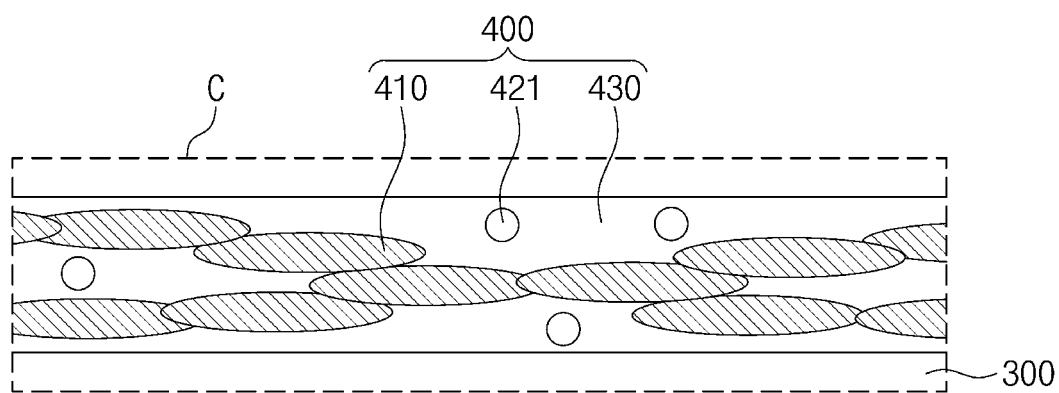
FIG. 1D illustrates a cross-sectional view showing a shield layer according to some example embodiments.
Figure 1E:
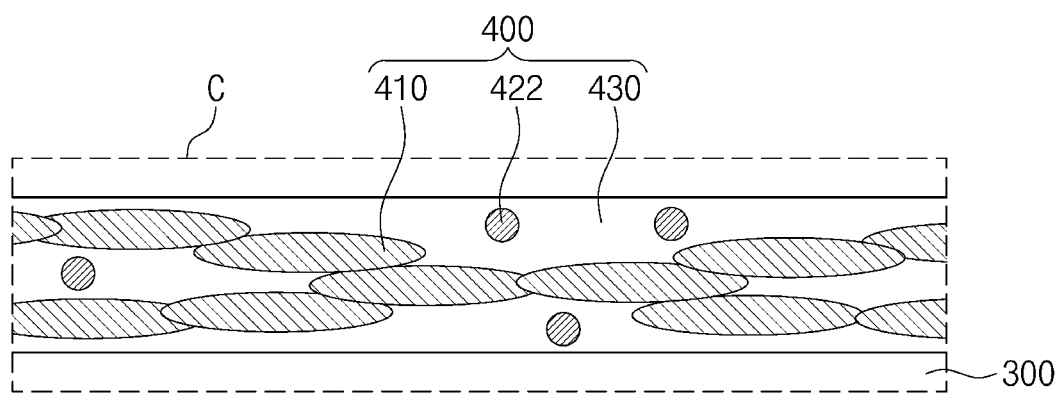
FIG. 1E illustrates a cross-sectional view showing a shield layer according to some example embodiments.

FIGS. 1D and 1E illustrate enlarged views of section C shown in FIG. 1B, showing a shield layer according to some example embodiments. A duplicate description will be omitted below. FIGS. 1A and 1B will also be referred to describe the following embodiments with reference to FIGS. 1D and 1E.

Referring to FIG. 1D, the shield layer 400 may include the polymer 430, the conductive structures 410, and the first nano-structures 421. The shield layer 400 may not include second nano-structures 422. The polymer 430, the conductive structures 410, and the first nano-structures 421 may be substantially the same as those discussed with reference to FIG. 1C.

Referring to FIG. 1E, the shield layer 400 may include the polymer 430, the conductive structures 410, and the second nano-structures 422. The shield layer 400 may include no first nano-structures 421.

Figure 2A:
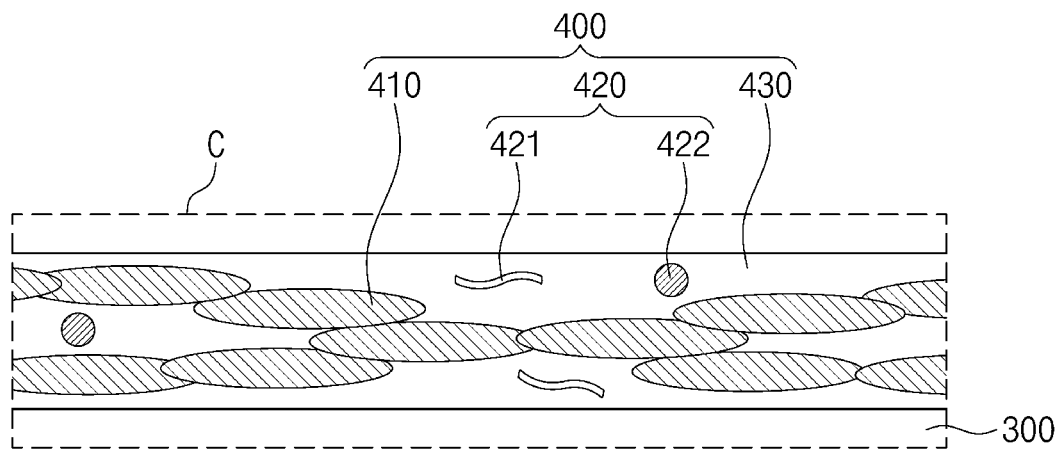
FIG. 2A illustrates a cross-sectional view showing a shield layer according to some example embodiments.
Figure 2B:
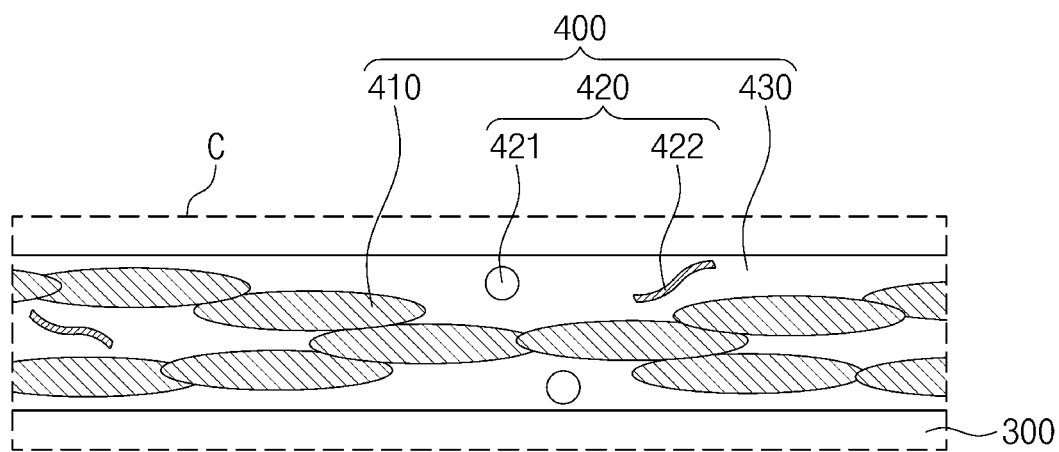
FIG. 2B illustrates a cross-sectional view showing a shield layer according to some example embodiments.
Figure 2C:
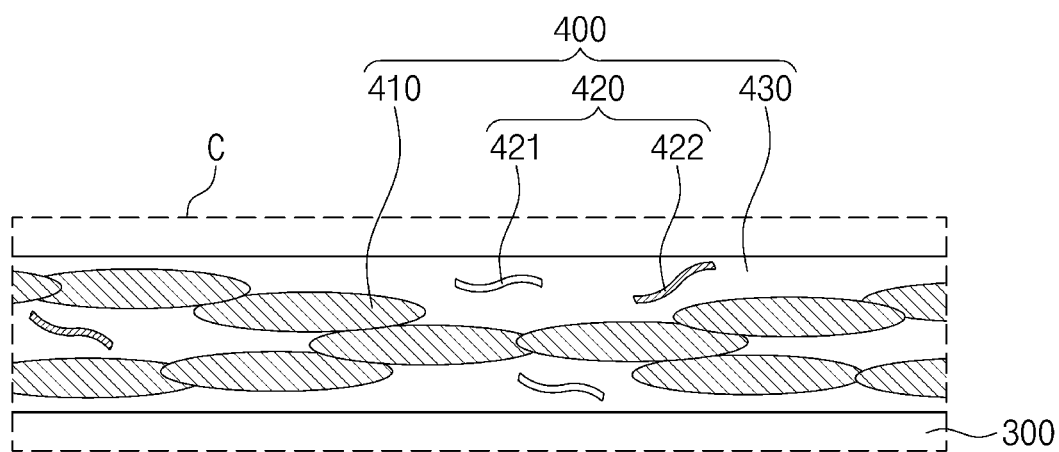
FIG. 2C illustrates a cross-sectional view showing a shield layer according to some example embodiments.

FIGS. 2A to 2C illustrate enlarged views of section C shown in FIG. 1B, showing a shield layer according to some example embodiments. A duplicate description will be omitted below. FIG. 1B will also be referred in describing the following embodiments with reference to FIGS. 2A to 2C.

Referring to FIGS. 2A to 2C, the shield layer 400 may include the conductive structures 410, the nano-structures 420, and the polymer 430. The conductive structures 410 and the nano-structures 420 may be provided in the polymer 430. The nano-structure 420 may include the first nano-structure 421 and the second nano-structure 422. The shape of the nano-structures 420 may be variously changed. For example, either the first nano-structure 421 or the second nano-structure 422 may include a nano-wire. The nano-wire may have a relatively high aspect ratio. For example, the nano-wire may have a higher aspect ratio than that of nano-particles. As shown in FIG. 2A, the first nano-structures 421 may include nano-wires, and the second nano-structures 422 may include nano-particles. As shown in FIG. 2B, the first nano-structures 421 may include nano-particles, and the second nano-structures 422 may include nano-wires. As shown in FIG. 2C, the first nano-structures 421 may include nano-wires, and the second nano-structures 422 may include nano-wires. In certain embodiments, an average diameter of the nano-wires may be less than an average of minimum diameters of the conductive structures 410. For example, the average diameter of the nano-wires may be about 0.01 nm to about 100 nm, for example, about 0.01 nm to about 10 nm. Because the nano-structures 420 include the nano-wires whose diameters are relatively small, the shield layer 400 may have low resistance characteristics.

The first nano-structures 421 may include silicon or silicon oxide, as discussed in FIG. 1C. The second nano-structures 422 may include metal or metal oxide. However, the metal included in the second nano-structures 422 may be different from that included in the conductive structures 410. An amount of the nano-structures 420 may be about 0.01% to about 10% of that of the conductive structures 410.

Alternatively, in the embodiments shown in FIGS. 2A to 2C, the shield layer 400 may not include the first nano-structures 421 or the second nano-structures 422.

Figure 3A:
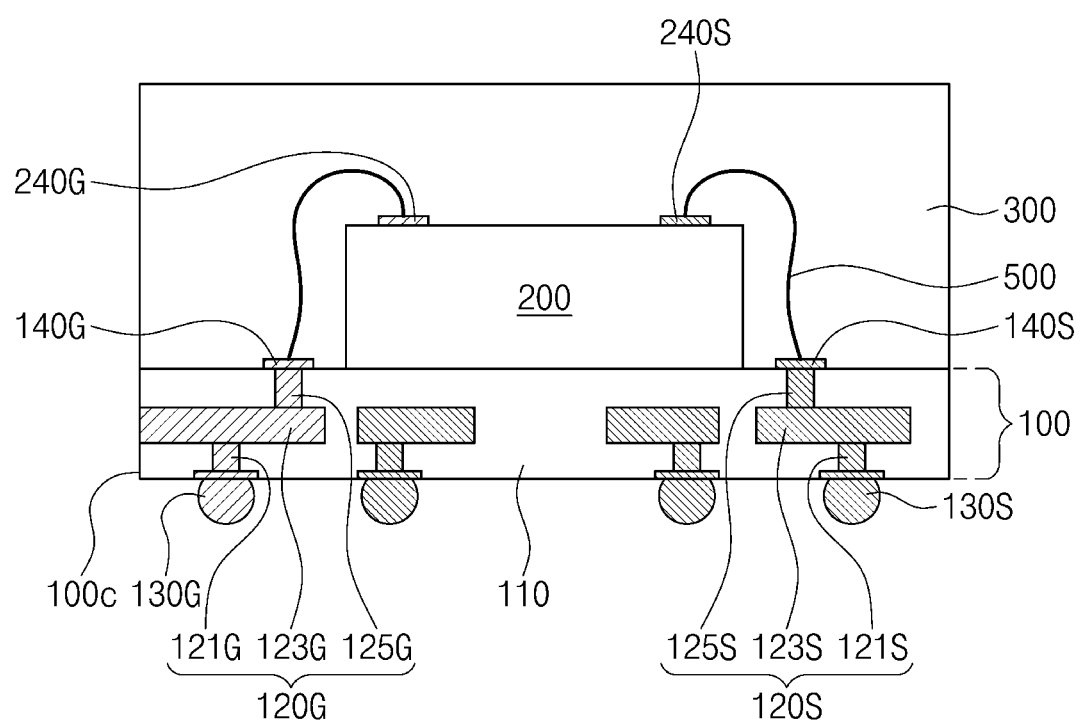
FIGS. 3A and 3B illustrate cross-sectional views showing a method of fabricating a semiconductor package according to some example embodiments.
Figure 3B:
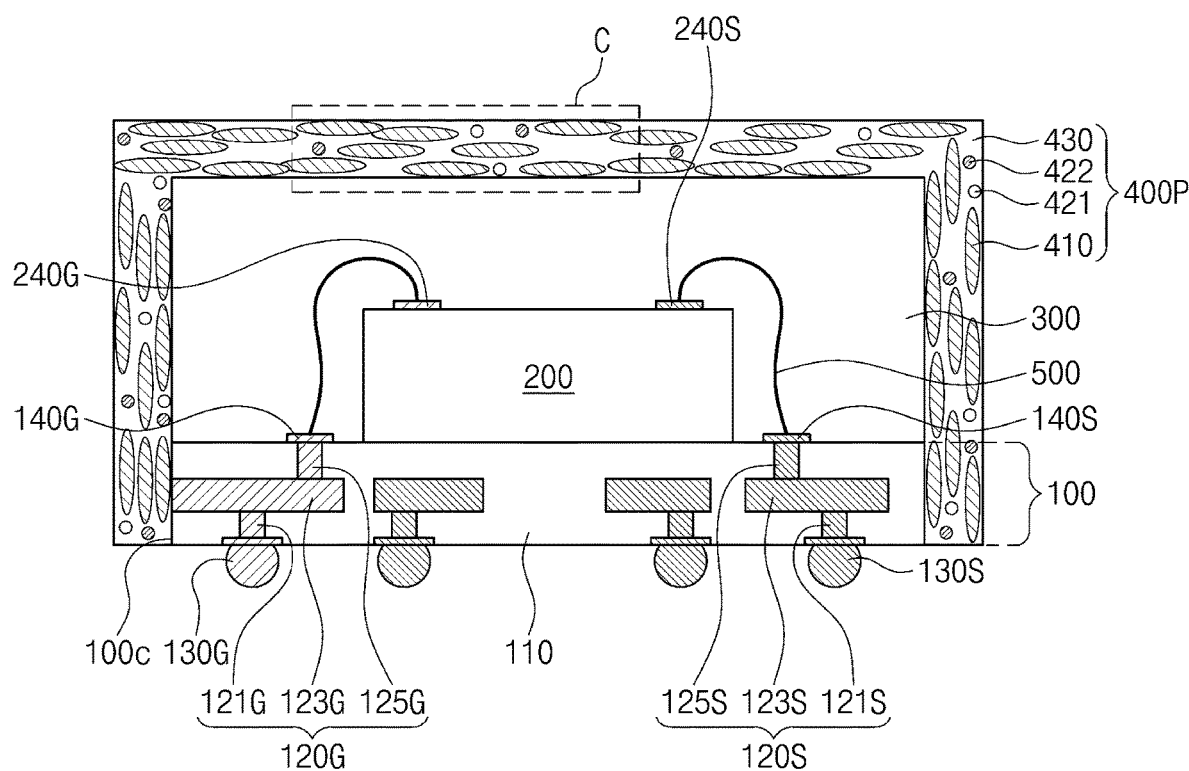
Figure 3C:
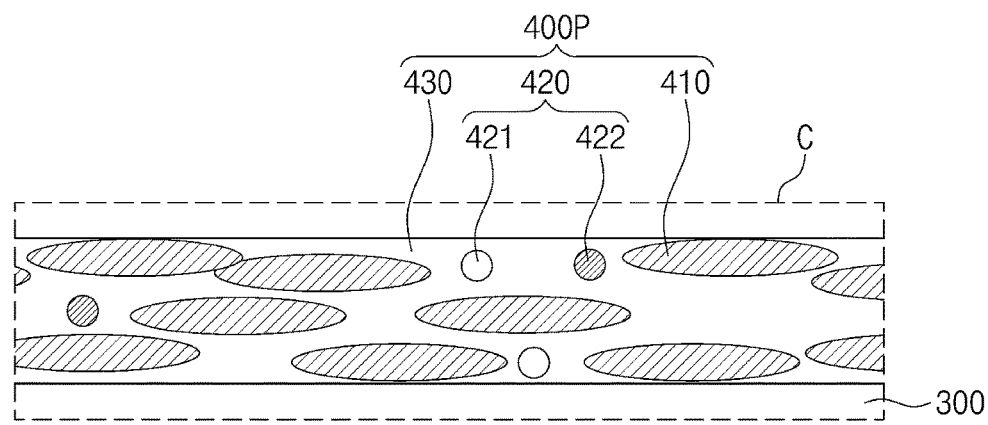
FIG. 3C illustrates an enlarged view showing section C of FIG. 3B.

FIGS. 3A and 3B illustrate cross-sectional views taken along line A-B of FIG. 1A, showing a method of fabricating a semiconductor package according to some example embodiments. FIG. 3C illustrates an enlarged view showing section C of FIG. 3B.

Referring to FIG. 3A, a semiconductor chip 200 may be mounted on a substrate 100. For example, connection terminals 500 may be formed on the semiconductor chip 200 to have connection with corresponding chip pads 240G and 240S and with corresponding substrate pads 140G and 140S. A molding layer 300 may be formed on the substrate 100, covering the semiconductor chip 200. The mounting of the semiconductor chip 200 and the formation of the molding layer 300 may be performed in a chip-level or wafer-level.

Referring to FIG. 3B, a coating solution may be coated on top and side surfaces of the molding layer 300 and on side surfaces 100c of the substrate 100, forming a preliminary shield layer 400P. The preliminary shield layer 400P may physically contact a ground pattern 123G of the substrate 100. The coating solution may include a polymer 430, conductive structures 410, nano-structures 420, and a solvent. The solvent may include one or more of propylene glycol methyl ether acetate (PGMEA), water, and ethanol. The coating solution may be coated on the molding layer 300 by a spray coating technique. The nano-structures 420 may be the same as that discussed in the examples of FIG. 1C, 1D, 1E, 2A, 2B, or 2C. For brevity of description, the following will describe the nano-structures 420 discussed in the example of FIG. 1C, but the present inventive concepts are not limited thereto.

The preliminary shield layer 400P may include the same material as that of the coating solution. As illustrated in FIG. 3B, some of the conductive structures 410 may not be bonded to one another. The conductive structures 410 may not be physically connected to one another.

A curing process may be performed on the preliminary shield layer 400P to cure the polymer 430 in the preliminary shield layer 400P. The curing process of the preliminary shield layer 400P may be carried out at a temperature of about 90° C. to about 190° C. The solvent may volatilize during the curing process of the preliminary shield layer 400P.

Referring back to FIGS. 1A to 1C, the preliminary shield layer 400P may be thermally treated to form a shield layer 400. The thermal treatment of the preliminary shield layer 400P may be achieved by an infrared-ray reflow process that uses an infrared-ray heater. For another example, the preliminary shield layer 400P may be thermally treated using plasma or high-temperature nitrogen gas. For another example, the preliminary shield layer 400P may be thermally treated using a halogen lamp under vacuum condition.

Annealing may be performed such that the conductive structures 410 may be conglomerated/agglomerated and physically connected to one another. The shield layer 400 may therefore have a decreased resistance. When the preliminary shield layer 400P is annealed at a temperature less than about 150° C., the conductive structures 410 may not be satisfactorily connected to one another. When the preliminary shield layer 400P is annealed at a temperature greater than about 300° C., the molding layer 300 may be damaged. In certain embodiments, the preliminary shield layer 400P may be annealed at a temperature equal to or greater than about 150° C., for example, a temperature of about 150° C. to about 300° C. As a result, the shield layer 400 may have a low resistance, and the molding layer 300 may be prevented from damage.

Figure 4A:
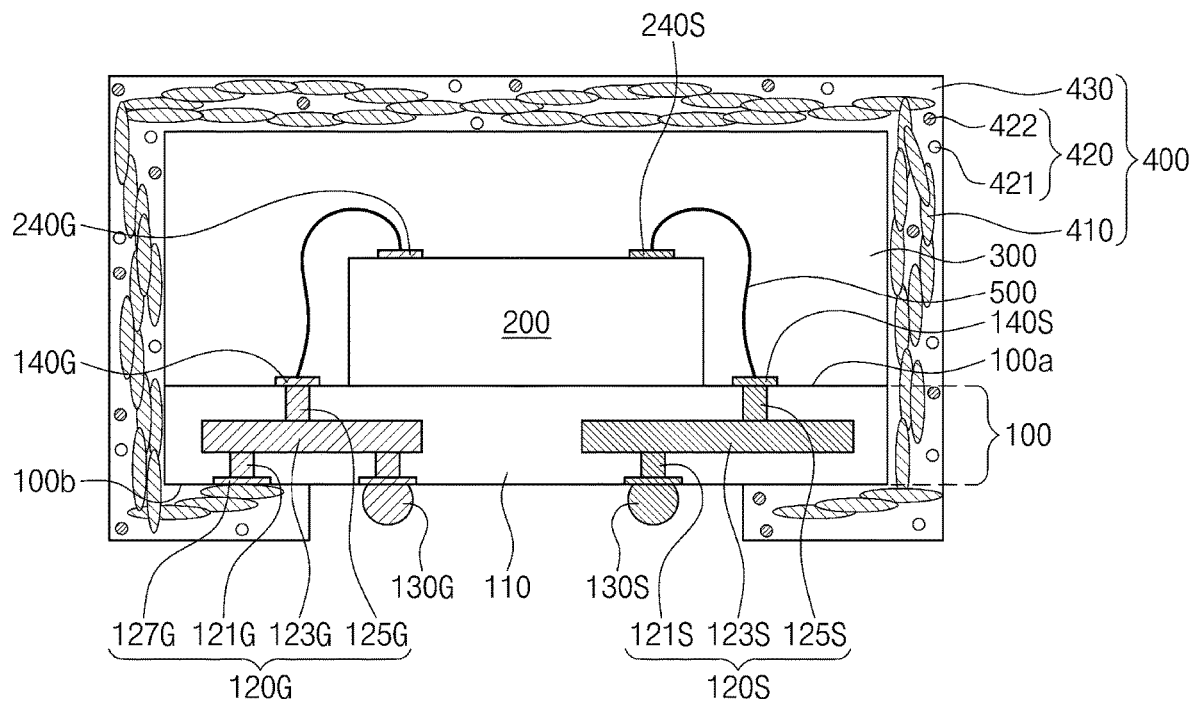
FIG. 4A illustrates a cross-sectional view showing a semiconductor package according to some example embodiments.

FIG. 4A illustrates a cross-sectional view showing a semiconductor package according to some example embodiments. A duplicate description will be omitted below.

Referring to FIG. 4A, a semiconductor package 2 may include a substrate 100, a semiconductor chip 200, a molding layer 300, and a shield layer 400. The semiconductor chip 200 and the molding layer 300 may be substantially the same as those discussed with reference to FIGS. 1A and 1B. The substrate 100 may have a top surface 100a and a bottom surface 100b opposite to each other. A ground structure 120G may include a plurality of lower ground vias 121G, a ground pattern 123G, an upper ground via 125G, and a lower ground pad 127G.

The lower ground pad 127G may be exposed on one surface of the substrate 100, and the one surface may correspond to the bottom surface 100b of the substrate 100. For example, the lower ground pad 127G may be exposed on the bottom surface 100b of an edge region of the substrate 100. One of the lower ground vias 121G may be interposed between and coupled to the lower ground pad 127G and the ground pattern 123G. A ground terminal 130G may be provided on a bottom surface of another of the lower ground vias 121G. The lower ground vias 121G may be electrically connected to each other through the ground pattern 123G. Therefore, the lower ground pad 127G may be coupled to the ground terminal 130G through the lower ground vias 121G and the ground pattern 123G.

The shield layer 400 may extend onto the bottom surface 100b of the substrate 100, being coupled to the exposed ground structures 120G. For example, the shield layer 400 may include conductive structures 410 coupled to the lower ground pad 127G. The shield layer 400 may be electrically grounded through the lower ground pad 127G, the lower ground vias 121G, the ground pattern 123G, and the ground terminal 130G.

For another example, no lower ground pad 127G may be provided. In this case, one of the lower ground vias 121G may be exposed on the bottom surface 100b of the substrate 100, and the shield layer 400 may be coupled to the one of the lower ground vias 121G.

The ground pattern 123G may be spaced apart from a side surface 100c of the substrate 100. For another example, the ground pattern 123G may further extend onto the side surface 100c of the substrate 100 and have electrical connection with the shield layer 400. The shield layer 400 may be spaced apart from ground and signal terminals 130G and 130S.

Figure 4B:
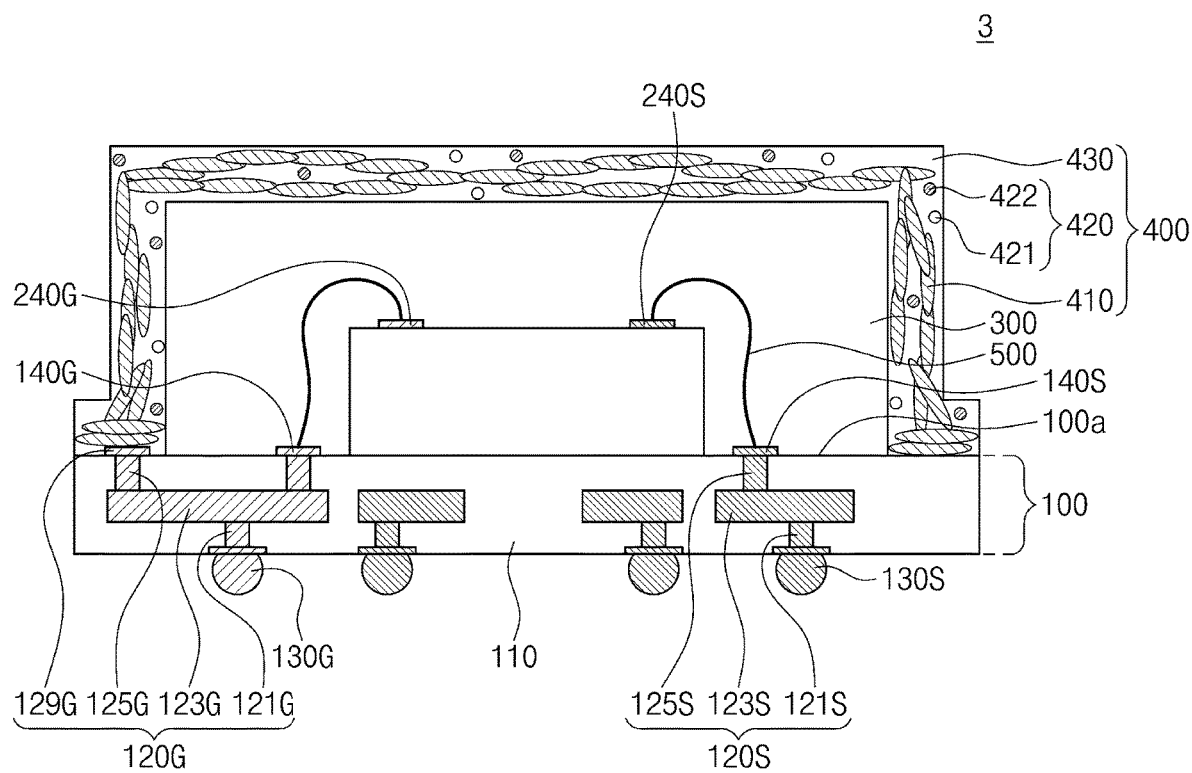
FIG. 4B illustrates a cross-sectional view showing a semiconductor package according to some example embodiments.

FIG. 4B illustrates a cross-sectional view showing a semiconductor package according to some example embodiments. A duplicate description will be omitted below.

Referring to FIG. 4B, a semiconductor package 3 may include a substrate 100, a semiconductor chip 200, a molding layer 300, and a shield layer 400. A ground structure 120G may include a lower ground via 121G, a ground pattern 123G, an upper ground via 125G, and an upper ground pad 129G. The upper ground via 125G may be provided in plural. The upper ground pad 129G may be provided on and coupled to one of the upper ground vias 125G. The upper ground pad 129G may be exposed on one surface of the substrate 100, and the one surface may be a top surface 100a of the substrate 100. For example, the upper ground pad 129G may be exposed on the top surface 100a of an edge region of the substrate 100.

The molding layer 300 may be disposed on the top surface 100a of the substrate 100. The molding layer 300 may have a width less than that of the substrate 100. The molding layer 300 may reveal the top surface 100a of the edge region of the substrate 100. The molding layer 300 may reveal at least a portion (e.g., the upper ground pad 129G) of the ground structure 120G.

The shield layer 400 may be disposed on the molding layer 300. The shield layer 400 may extend onto the top surface 100a of the substrate 100, which is exposed by the molding layer 300, and may have connection with the upper ground pad 129G. The shield layer 400 may be electrically grounded through the upper ground pad 129G, one of the upper ground vias 125G, the ground pattern 123G, the lower ground via 121G, and a ground terminal 130G. The shield layer 400 may further extend onto a side surface 100c of the substrate 100, but the present inventive concepts are not limited thereto.

Differently from that shown, no upper ground pad 129G may be provided. In this case, one of the upper ground vias 125G may be exposed on the top surface 100a of the substrate 100. The one of the upper ground vias 125G may be spaced apart from the molding layer 300. The shield layer 400 may directly contact the one of the upper ground vias 125G.

According to the present inventive concepts, a shield layer may include conductive structures and nano-structures. The conductive structures of the shield layer may shield an electromagnetic wave. The nano-structures of the shield layer may shield an X-ray. A semiconductor chip may be prevented from damage caused by the X-ray when a semiconductor package is fabricated. The nano-structures may be distributed in the shield layer, and thus, the shield layer may have low resistance characteristics. The semiconductor package may improve in reliability.

This detailed description of the example embodiments should not be construed as limiting the inventive concept, and it is intended that the inventive concepts cover the various combinations, the modifications and variations of the above-described embodiments without departing from the spirit and scope of the inventive concepts. The appended claims should be construed to include other embodiments.

What is claimed is:

1. A semiconductor package, comprising:
a substrate;
a semiconductor chip on the substrate;
a molding layer, on the substrate, covering the semiconductor chip; and
a shield layer on the molding layer,
wherein the shield layer comprises a polymer in which a plurality of conductive structures and a plurality of nano-structures are distributed,
wherein at least some of the conductive structures are directly connected to one another,
wherein the nano-structures are provided in a gap between the plurality of conductive structures and spaced apart from the plurality of conductive structures,
wherein resistance of the plurality of nano-structures is greater than resistance of the plurality of conductive structures, and
wherein an amount of the nano-structures is 0.01% to 10% of an amount of the plurality of conductive structures.

2. The semiconductor package of claim 1, wherein the substrate comprises a ground structure exposed on one surface of the substrate,
wherein at least a portion of the one surface of the substrate is covered by the shield layer, and
wherein the shield layer is connected to the ground structure.

3. The semiconductor package of claim 1, wherein the conductive structures are configured to shield an electromagnetic wave, and
wherein the nano-structures are configured to shield an X-ray.

4. The semiconductor package of claim 1, wherein an average diameter of the nano-structures is less than an average of the minimum diameters of the conductive structures.

5. The semiconductor package of claim 1, wherein the nano-structures comprise nano-particles and/or nano-wires.

6. The semiconductor package of claim 1, wherein the nano-structures comprise a semiconductor material.

7. A semiconductor package, comprising:
a substrate;
a semiconductor chip on the substrate;
a molding layer, on the substrate, covering the semiconductor chip; and
a shield layer, on the molding layer, comprising:
a plurality of conductive structures connected to one another; and
a plurality of first nano-structures, in the shield layer, comprising a semiconductor material,
wherein the first nano-structures are provided in a gap between the plurality of conductive structures and spaced apart from the plurality of conductive structures,
wherein resistance of the plurality of first nano-structures is greater than resistance of the plurality of conductive structures, and wherein an amount of the first nano-structures is 0.01% to 10% of an amount of the plurality of conductive structures.

8. The semiconductor package of claim 7,
wherein an average diameter of the first nano-structures is less than an average of the minimum diameters of the conductive structures.

9. The semiconductor package of claim 7, wherein the conductive structures are configured to shield an electromagnetic wave having a frequency of about 1 GHz to about 6 GHz, and
wherein the first nano-structures are configured to shield a soft X-ray.

10. The semiconductor package of claim 7, wherein the shield layer further comprises a plurality of second nano-structures,
wherein the second nano-structures comprises metal or metal oxide.

11. A semiconductor package, comprising:
a substrate;
a semiconductor chip on the substrate;
a molding layer, on the substrate, covering the semiconductor chip; and
a shield layer on the molding layer,
wherein the shield layer comprises a plurality of electromagnetic-wave shielding structures and a plurality of X-ray shielding structures,
wherein the X-ray shielding structures comprise a semiconductor material,
wherein the X-ray shielding structures are provided in a gap between the plurality of electromagnetic-wave shielding structures and spaced apart from the plurality of electromagnetic-wave shielding structures, and
wherein resistance of the plurality of X-ray shielding structures is greater than resistance of the plurality of electromagnetic-wave shielding structures.

12. The semiconductor package of claim 11, wherein an amount of the X-ray shielding structures is less than an amount of the electromagnetic-wave shielding structures, and wherein an average diameter of the X-ray shielding structures is less than an average of the minimum diameters of the electromagnetic-wave shielding structures.

13. The semiconductor package of claim 11, wherein the X-ray shielding structures include:
   a plurality of first nano-structures configured to shield an X-ray having a first energy; and
   a plurality of second nano-structures configured to shield an X-ray having a second energy different from the first energy.

14. The semiconductor package of claim 11, wherein the electromagnetic-wave shielding structures are connected to one another, and
   wherein the X-ray shielding structures are distributed in the shield layer.

15. The semiconductor package of claim 11, wherein the electromagnetic-wave shielding structures comprise metal or metal oxide.

16. The semiconductor package of claim 11, wherein the X-ray shielding structures comprise nano-particles and/or nano-wires.

17. The semiconductor package of claim 11, wherein the X-ray shielding structures comprise metal or metal oxide.

* * * * *